United States Patent
Yamazaki et al.

(10) Patent No.: US 9,177,979 B2
(45) Date of Patent: Nov. 3, 2015

(54) SOLID-STATE IMAGE PICKUP DEVICE HAVING REFERENCE VOLTAGE SUPPLY LINE ON A FIRST SUBSTRATE AND POWER SUPPLY LINES TO SUPPLY VOLTAGES TO THE REFERENCE VOLTAGE SUPPLY LINE ON A SECOND SUBSTRATE

(75) Inventors: Kazuo Yamazaki, Yokohama (JP);
Tetsuya Itano, Sagamihara (JP);
Nobuyuki Endo, Fujisawa (JP);
Kyouhei Watanabe, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 551 days.

(21) Appl. No.: 13/515,445

(22) PCT Filed: Dec. 13, 2010

(86) PCT No.: PCT/JP2010/007227
§ 371 (c)(1),
(2), (4) Date: Jun. 12, 2012

(87) PCT Pub. No.: WO2011/074235
PCT Pub. Date: Jun. 23, 2011

(65) Prior Publication Data
US 2012/0248293 A1    Oct. 4, 2012

(30) Foreign Application Priority Data
Dec. 18, 2009  (JP) ................... 2009-288459

(51) Int. Cl.
*H01L 27/00* (2006.01)
*H01L 27/146* (2006.01)

(52) U.S. Cl.
CPC ...... *H01L 27/14609* (2013.01); *H01L 27/1465* (2013.01)

(58) Field of Classification Search
CPC ............ H01L 27/14609; H01L 27/1465; H01L 27/14603; H01L 27/14659; H01L 27/14634; H01L 27/14621; H01L 27/14632; H01L 27/14636; H01L 27/14612; H04N 5/33; H04N 5/35545; H04N 3/35563; H04N 5/335; H04N 5/3559; H04N 5/3745; H04N 5/374
USPC ................... 250/208.1, 214.1, 214 R, 214 A; 348/294, 297, 300, 301, 302, 303, 304, 348/308; 257/E27.133, E31.128, 432, 257, 257/258, 290–292, 444
See application file for complete search history.

(56) References Cited

U.S. PATENT DOCUMENTS

| | | | |
|---|---|---|---|
| 5,656,848 A | 8/1997 | Beratan et al. | |
| 7,551,059 B2 * | 6/2009 | Farrier | ............. 340/300 |

(Continued)

FOREIGN PATENT DOCUMENTS

| | | |
|---|---|---|
| JP | H08-162624 A | 6/1996 |
| JP | 2006-049361 A1 | 2/2006 |

(Continued)

*Primary Examiner* — Que T Le
*Assistant Examiner* — Jennifer Bennett
(74) *Attorney, Agent, or Firm* — Canon USA, Inc. IP Division

(57) ABSTRACT

A solid-state image pickup device includes a pixel region including photoelectric conversion units, FDs, and transfer transistors, reset transistors, amplifier transistors, and a reference voltage supply line used to supply reference voltages to the photoelectric conversion units. In the device, the pixel region and the reference voltage supply line are disposed on a first semiconductor substrate, and at least the reset transistors or the amplifier transistors are disposed on a second semiconductor substrate. Furthermore, power supply lines used to supply voltages to the reference voltage supply line are disposed on the second semiconductor substrate. The device further includes second electric connection units which electrically connect the reference voltage supply line to the power supply line. The first electric connection units are disposed in the pixel region whereas the second electric connection units are disposed outside the pixel region.

6 Claims, 5 Drawing Sheets

(56) References Cited

U.S. PATENT DOCUMENTS

| | | | |
|---|---|---|---|
| 7,956,394 B2 * | 6/2011 | Lee ................................ | 257/294 |
| 8,089,543 B2 * | 1/2012 | Iida ................................ | 348/308 |
| 2005/0185074 A1 * | 8/2005 | Yoneda et al. ................. | 348/294 |
| 2008/0083939 A1 * | 4/2008 | Guidash ......................... | 257/292 |
| 2009/0219422 A1 * | 9/2009 | Takeuchi et al. .............. | 348/300 |
| 2009/0256156 A1 | 10/2009 | Hsieh | |

FOREIGN PATENT DOCUMENTS

| | | |
|---|---|---|
| JP | 2008-235478 A | 10/2008 |
| JP | 2009-170448 A | 7/2009 |
| WO | 2006/073875 A2 | 7/2006 |

* cited by examiner

SOLID-STATE IMAGE PICKUP DEVICE HAVING REFERENCE VOLTAGE SUPPLY LINE ON A FIRST SUBSTRATE AND POWER SUPPLY LINES TO SUPPLY VOLTAGES TO THE REFERENCE VOLTAGE SUPPLY LINE ON A SECOND SUBSTRATE

TECHNICAL FIELD

The present invention relates to solid-state image pickup devices, and particularly relates to a solid-state image pickup device configured such that a photoelectric conversion unit and a peripheral circuit unit are disposed on different substrates.

BACKGROUND ART

In general, examples of a solid-state image pickup device include a solid-state image pickup device configured such that a photoelectric conversion unit and a peripheral circuit unit which are disposed on different substrates are electrically connected to each other using micro bumps. PTL 1 discloses a peripheral circuit unit which is used to read a signal from a photoelectric conversion unit such as a vertical scanning unit and a horizontal scanning unit and which is disposed on a second semiconductor substrate which is different from a first semiconductor substrate on which the photoelectric conversion unit is disposed.

Specifically, on the first semiconductor substrate, the photoelectric conversion unit, a floating diffusion (FD), a transfer transistor which transmits charge of the photoelectric conversion unit to the FD, and a reset transistor are disposed.

CITATION LIST

Patent Literature

PTL 1: Japanese Patent Laid-Open No. 2009-170448

SUMMARY OF INVENTION

Technical Problem

In general, the photoelectric conversion unit includes an output node which outputs a signal and a node to which a reference voltage is supplied. For example, when the photoelectric conversion unit corresponds to a photodiode, a signal is obtained from a cathode and a reference voltage is supplied to an anode. When electrons are used as signal carriers, a ground potential is supplied to the anode.

In PTL 1, FIG. 1 shows an equivalent circuit in which a ground potential is supplied to an anode of a photodiode. Furthermore, In PTL 1, FIG. 5 shows a sectional view illustrating a solid-state image pickup device.

However, in PTL 1, a method for supplying a reference voltage to a photoelectric conversion unit is not disclosed in detail.

According to researches made by inventors, a capacitance of the FD is increased depending on a method for supplying a reference voltage to the photoelectric conversion unit, and accordingly, sensitivity of pixels may be degraded.

The present invention provides a configuration for supply of a reference voltage to a photoelectric conversion unit in a case where the photoelectric conversion unit and a peripheral circuit unit are disposed on different substrates.

Solution to Problem

The present invention provides a solid-state image pickup device having a pixel region including photoelectric conversion units, floating diffusions, and transfer transistors which transfer charges of the photoelectric conversion units to the floating diffusions, a plurality of reset transistors which supply reset potentials to the floating diffusions, a plurality of amplifier transistors which amplify signals obtained in accordance with potential changes of the floating diffusions and output the signals, a reference voltage supply line which supplies reference voltages to the photoelectric conversion units, a first semiconductor substrate including the pixel region and the reference voltage supply line, and a second semiconductor substrate including at least the reset transistors or the amplifier transistors. The solid-state image pickup device includes power supply lines configured to supply voltages to the reference voltage supply line and disposed on the second semiconductor substrate, a plurality of first electric connection units configured to electrically connect the floating diffusions to the reset transistors and the amplifier transistors which are disposed on the second semiconductor substrate, and a plurality of second electric connection units configured to electrically connect the reference voltage supply line to the power supply lines. The first electric connection units are disposed in the pixel region and the second electric connection units are disposed outside the pixel region.

Advantageous Effects of Invention

Accordingly, using a solid-state image pickup device having photoelectric conversion units and peripheral circuit units disposed on different substrates, reference voltages can be supplied to the photoelectric conversion units without increasing capacitance values of floating diffusions.

DESCRIPTION OF EMBODIMENTS

Figure 1A:
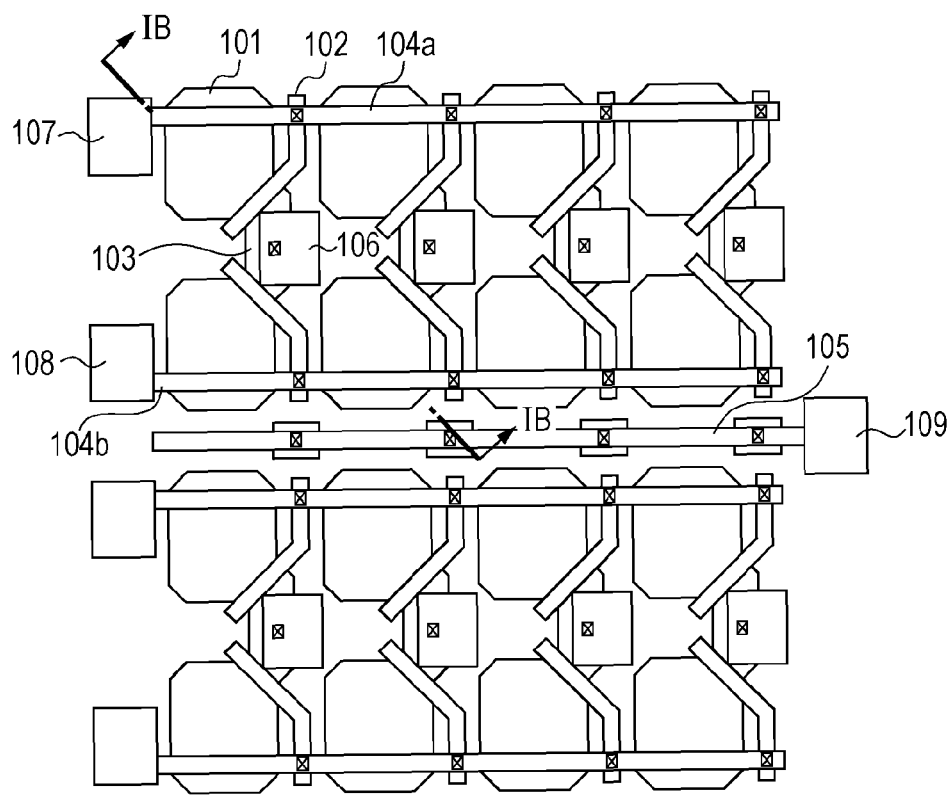
FIG. 1A is a top view illustrating a first semiconductor substrate of a solid-state image pickup device according to a first embodiment.

Each of pixels of a solid-state image pickup device according to the present invention includes a photoelectric conversion unit, a floating diffusion (FD), and a transfer transistor which transmits a charge of the photoelectric conversion unit to the FD. Each of the pixels further includes a reset transistor which uses a potential of the FD as a reset potential and an amplifier transistor which amplifies (performs charge amplification) and outputs a signal obtained on the basis of a potential change of the FD.

A pixel region including a plurality of photoelectric conversion units, FDs, and transfer transistors is disposed on a first semiconductor substrate.

On the other hand, a plurality of common output lines to which signals are supplied from the pixels are disposed on a second semiconductor substrate. Furthermore, a peripheral circuit unit including a reading circuit and a scanning circuit which reads signals from the pixels is disposed on the second semiconductor substrate in a stage following the pixels.

Other pixel elements should be disposed on one of the first and second semiconductor substrates. However, at least reset transistors or amplifier transistors are preferably disposed on the second semiconductor substrate.

When at least the reset transistors or the amplifier transistors are disposed on the second semiconductor substrate, electric connection units (first electric connection unit) which electrically connect the FDs to the reset transistors or the amplifier transistors are required.

Here, the electric connection units are disposed on each of the semiconductor substrates. The electric connection units are used to electrically connect the first and second semiconductor substrate using a part of conduction pattern included in a line layer, for example.

Furthermore, on the first semiconductor substrate, a reference voltage supply line used to supply reference voltages to the photoelectric conversion units is disposed. The reference voltages are supplied from the reference voltage supply line to the photoelectric conversion units included in the pixel region. Note that, the reference voltages are supplied to the photoelectric conversion units through a plurality of contact plugs. Therefore, the plurality of contact plugs used to supply the reference voltages to the photoelectric conversion units are arranged on the pixel region of the first semiconductor substrate. Furthermore, power supply lines used to supply the reference voltages to the reference voltage supply line are disposed on the second semiconductor substrate. The reference voltage supply line and the power supply lines are electrically connected to each other through electric connection units (second electric connection units). The reference voltages are supplied from an outside of the second semiconductor substrate to the power supply lines.

The present invention defines a concrete arrangement position of the first and second electric connection units.

Hereinafter, the solid-state image pickup device according to embodiments of the present invention will be described in detail. In the embodiments, a case where an electron is used as a signal charge will be described. When a hole is used, a conduction type of each semiconductor region should be inverted.

First Embodiment

Figure 1B:
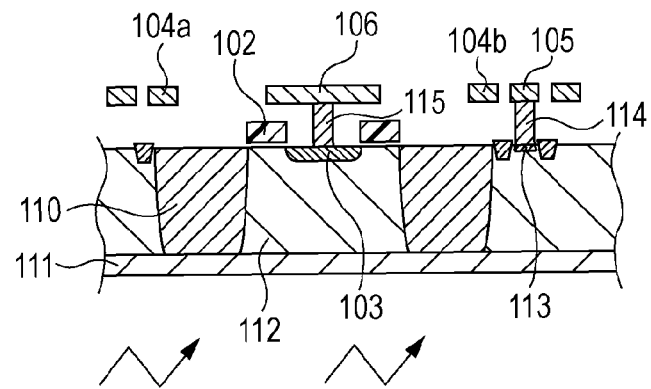
FIG. 1B is a schematic sectional view of the first semiconductor substrate taken along a line IB-IB shown in FIG. 1A.

FIG. 1A is a top view illustrating a solid-state image pickup device according to a first embodiment. Specifically, FIG. 1A is a top view illustrating a first semiconductor substrate including a photoelectric conversion unit disposed thereon. FIG. 1B is a sectional view of the first semiconductor substrate taken along a line IB-IB shown in FIG. 1A.

In FIG. 1A, a pixel region including pixels arranged in a matrix of four rows and four columns is shown. However, a more number of configuration elements may be arranged and the configuration elements may be arranged in a line.

Each of photoelectric conversion units 101 converts incident light into a charge pair of an electron and a hole and collects an electron as a signal charge. PN junction photodiodes may be used as the photoelectric conversion units 101, for example. P-type semiconductor regions function as anodes and ground potentials serving as reference voltages are supplied to the anodes.

Each of polysilicon portions 102 constitutes a gate electrode of a transfer transistor which transmits a charge of the photoelectric conversion unit 101 to a corresponding one of FDs. A reference numeral 103 denotes one of the FDs. The charges of the photoelectric conversion units 101 are transmitted to the FDs 103 by the transfer transistors. Each of the FDs 103 includes an N-type semiconductor region.

Transfer control lines 104a and 104b supply driving signals to gates of the transfer transistors.

A reference voltage supply line 105 supplies a reference voltage to the photoelectric conversion units 101. The reference voltage supply line 105 supplies a potential to the photoelectric conversion units 101 through contact plugs in a plurality of regions included in the pixel region. The contact plugs may be directly connected to a semiconductor region included in the photoelectric conversion unit 101, or reference voltages may be supplied through P-type semiconductor regions serving as channel sections of the transfer transistors or P-type semiconductor regions used to isolates adjacent pixels. The P-type semiconductor regions serving as the channel sections of the transfer transistors may be referred to as "wells". When a well reference voltage is to be supplied, the reference voltage supply line 105 may also serve as a well potential supply line.

First electric connection units 106 are electrically connected to the FDs 103 through the contact plugs so that the FDs 103 are electrically connected to gates of amplifier transistors disposed on the second semiconductor substrate. In this embodiment, a case where both of reset transistors and the amplifier transistors are disposed on the second semiconductor substrate is described. However, at least one of the reset transistors and the amplifier transistors may be disposed on the second semiconductor substrate. In a case where both of the reset transistors and the amplifier transistors are disposed on the second semiconductor substrate, the FDs 103 are electrically connected to sources of the reset transistors and gates of the amplifier transistors.

Second electric connection units 109 is used to electrically connect the reference voltage supply line 105 to power supply lines disposed on the second semiconductor substrate.

Third electric connection units 107 and 108 are used to electrically connect the transfer control lines 104a and 104b to a transfer scanning circuit disposed on the second semiconductor substrate.

N-type semiconductor regions 110 serve as portions of the photoelectric conversion units 101 and collect electrons corresponding to signal charges. The solid-state image pickup device of this embodiment has a back-surface irradiation configuration configured such that light is received by a main surface arranged opposite to a surface including the transistors and the lines, that is, light is received from a lower side of the drawing.

P-type semiconductor regions 111 constitute PN junctions with the N-type semiconductor regions 110 and function as common anodes of the photoelectric conversion units 101.

P-type semiconductor regions 112 serve as channels of the transfer transistors, and may be referred to as "wells".

Highly-concentrated P-type semiconductor regions 113 are electrically connected to the reference voltage supply line 105 through contact plugs 114. The highly-concentrated P-type semiconductor regions 113 are used to apply reference voltages to P-type semiconductor regions 111 and 112.

Contact plugs 115 are used to electrically connect the FDs 103 to the first electric connection units 106.

In this embodiment, the second electric connection units 109 are disposed outside the pixel region. The arrangement position of the second electric connection units 109 will now be described.

As a comparative example, third electric connection units may be disposed so as to correspond to the contact plugs 114. In this case, a plurality of the second electric connection units and lines arranged adjacent to the second electric connection units (except for the reference voltage supply line 105) should be disposed with predetermined gaps therebetween. If the gaps are small, the second electric connection units and the adjacent lines cause short circuit in a process of electrically connecting the first and second semiconductor substrates to each other, and accordingly, a point defect or a linear defect may occur.

Therefore, the certain gaps should be ensured by shifting the transfer control line 104b upward in the drawing, for example. However, in this case, distances between the transfer control line 104b and the first electric connection units 106 become smaller. When the distances between the first electric connection units 106 and the transfer control line 104b become smaller by a certain degree or more, FD capacitance values are increased, which is not preferable. The FDs 103 have a function of converting a transmitted charge into a voltage using a PN junction capacitance constituted by the FD 103 and a surrounding P-type semiconductor region and a parasitic capacitance (which constitute an FD capacitance). Note that values of FD capacitances directly relate to sensitivities of the pixels. Specifically, when an FD capacitance value is large, a potential change amount per unit charge amount is small whereas when an FD capacitance value is small, a potential change amount per unit charge amount is large. Accordingly, a sensitivity of a pixel is improved when a FD capacitance value is small. Note that each of the first electric connection units 106 and a corresponding one of the FDs 103 constitute an identical node in terms of electricity since the first electric connection units 106 are electrically connected to the FDs 103. Therefore, parasitic capacitances generated by the first electric connection units 106 and lines adjacent to the first electric connection units 106 correspond to the FD capacitances. That is, when the transfer control line 104b is arranged in a position closer to the first electric connection units 106, the FD capacitance values are increased, and consequently, the sensitivities of the pixels are degraded.

This is a problem newly found by the inventers when the FDs 103 disposed on the first semiconductor substrate are to be electrically connected to members disposed on the second semiconductor substrate. Since the FDs 103 should be electrically connected to the members disposed on the second semiconductor substrate for individual pixels or for each group of pixels, the first electric connection units 106 should be disposed in the pixel region. Furthermore, the first electric connection units 106 should have certain areas so as to reliably perform electric connection. When an additional electric connection unit is disposed in the pixel region while the certain areas of the first electric connection units 106 are ensured, it is inevitable that the FD capacitance values are increased.

On the other hand, according to this embodiment, since the second electric connection units 109 are disposed outside the pixel region, the certain areas of the first electric connection units 106 are ensured while distances between the first electric connection units 106 and the adjacent lines can be ensured. Accordingly, increase of the FD capacitance value can be suppressed and reference voltages can be supplied to the photoelectric conversion units 101 without deteriorating the sensitivities of the pixels.

Figure 2:
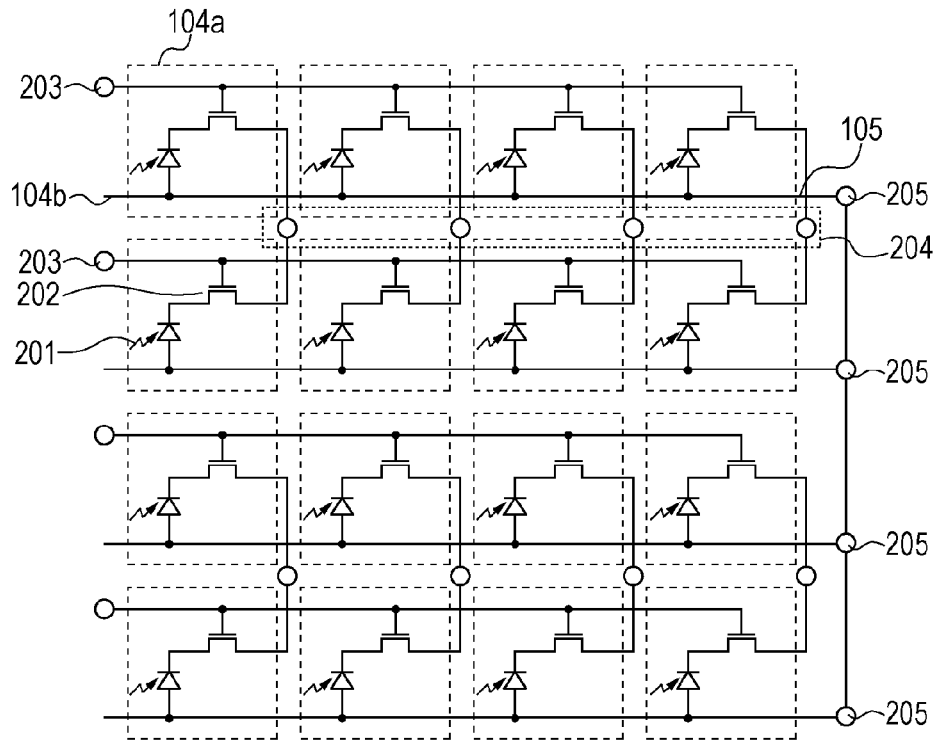
FIG. 2 is an equivalent circuit including pixel configuration elements arranged on the first semiconductor substrate according to the first embodiment.

FIG. 2 is an equivalent circuit representing the electric connection relationship among elements which constitute the pixels and which are arranged on the first semiconductor substrate. Components having functions the same as those of the components shown in FIG. 1 are denoted by reference numerals the same as those used in FIG. 1, and detailed descriptions thereof are omitted.

A reference numeral 201 denotes one of the photoelectric conversion units, a reference numeral 202 denotes one of the transfer transistors, a reference numeral 203 denotes one of the third electric connection units, a reference numeral 204 denotes one of the first electric connection units, and reference numerals 205 denote the second electric connection units. Note that photodiodes are used as the photoelectric conversion units 201. Cathodes of the photodiodes are connected to sources of the transfer transistors 202 and drains of the transfer transistors 202 serve as FDs. Each of the cathodes of the photodiodes and a corresponding one of the transfer transistors 202 should constitute an identical node using a semiconductor region or a plurality of semiconductor regions. Each of regions denoted by dotted lines represents a single pixel.

Figure 3A:
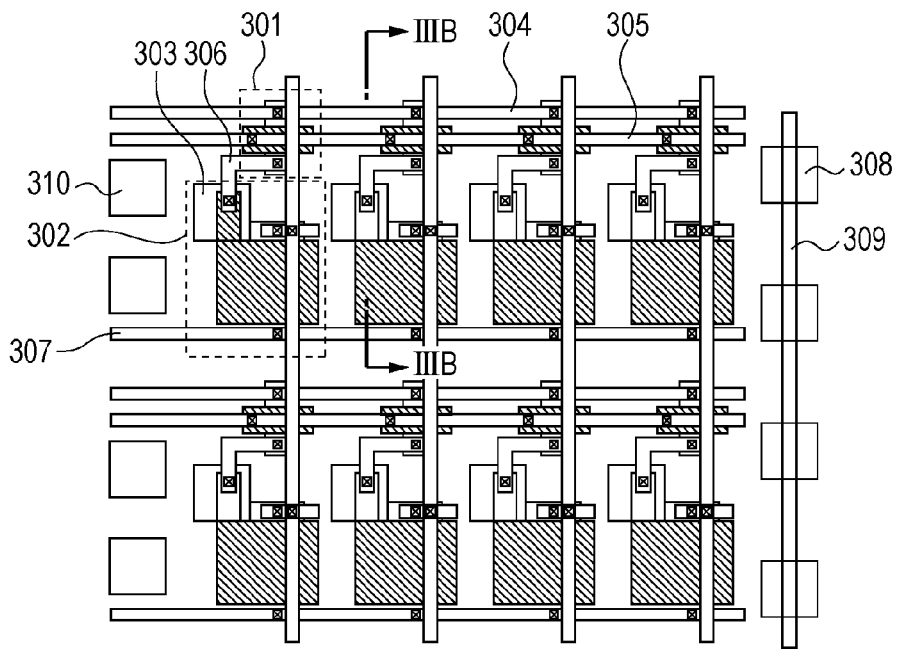
FIG. 3A is a top view illustrating a second semiconductor substrate of the solid-state image pickup device according to the first embodiment.
Figure 3B:
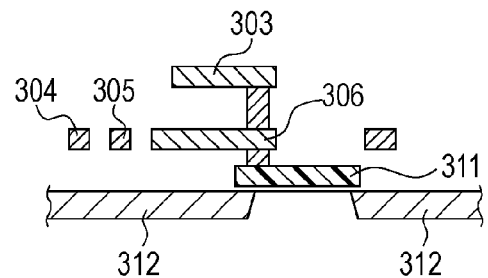
FIG. 3B is a schematic sectional view of the second semiconductor substrate taken along a line IIIB-IIIB shown in FIG. 3A.

FIG. 3A is a top view illustrating the second semiconductor substrate. FIG. 3B is a sectional view of the second semiconductor substrate taken along a line IIIB-IIIB shown in FIG. 3A.

A reference numeral 301 denotes one of the reset transistors and a reference numeral 302 denotes one of the amplifier transistors. Hatched portions included in portions defined by dotted lines correspond to polysilicon portions constituting gate electrodes of the transistors. Source regions and drain regions are formed so as to sandwich the gate electrodes therebetween. Gate areas of the amplifier transistors 302 are larger than gate areas of the reset transistors 301. With this configuration, 1/f noise generated in the amplifier transistors 302 can be suppressed. Note that the gate areas correspond to areas of the polysilicon portions which cover channel portions of the transistors. That is, the areas of the polysilicon portions over the channel portions contribute the generation of the 1/f noise.

Fourth electric connection units 303 are electrically connected to the first electric connection units disposed on the first semiconductor substrate through micro bumps or the like. The fourth electric connection units 303 are further electrically connected to gates of the amplifier transistors 302 and sources of the reset transistors 301.

Reset drain supply lines 304 are used to supply voltages to the drains of the reset transistors 301. Reset gate control lines 305 are used to supply driving signals to the gates of the reset transistors 301. Local lines 306 are used to electrically connect sources of the reset transistors 301 to the gates of the amplifier transistors 302. Voltage supply lines 307 are used to supply voltages to the drains of the amplifier transistors 302.

Fifth electric connection units 308 are electrically connected to the second electric connection units disposed outside the pixel region of the first semiconductor substrate through micro bumps or the like. As with the second electric connection units, the fifth electric connection units are also disposed outside the pixel region. The fifth electric connection units 308 receive reference voltages, e.g., ground potentials from power supply lines, not shown. Furthermore, reference voltages are supplied to the power supply lines from the outside of the second semiconductor substrate.

A line 309 is used to connect the fifth electric connection units to one another.

Sixth electric connection units 310 are electrically connected to the third electric connection units disposed on the first semiconductor substrate through micro bumps or the like.

Polysilicon portions 311 constitute the gates of the amplifier transistors 302. A reference numeral 312 denotes one of element isolation regions. The polysilicon portions 311 are disposed so as to cover the channels of the amplifier transistors 302 and portions of the element isolation regions 312 from above.

Figure 4:
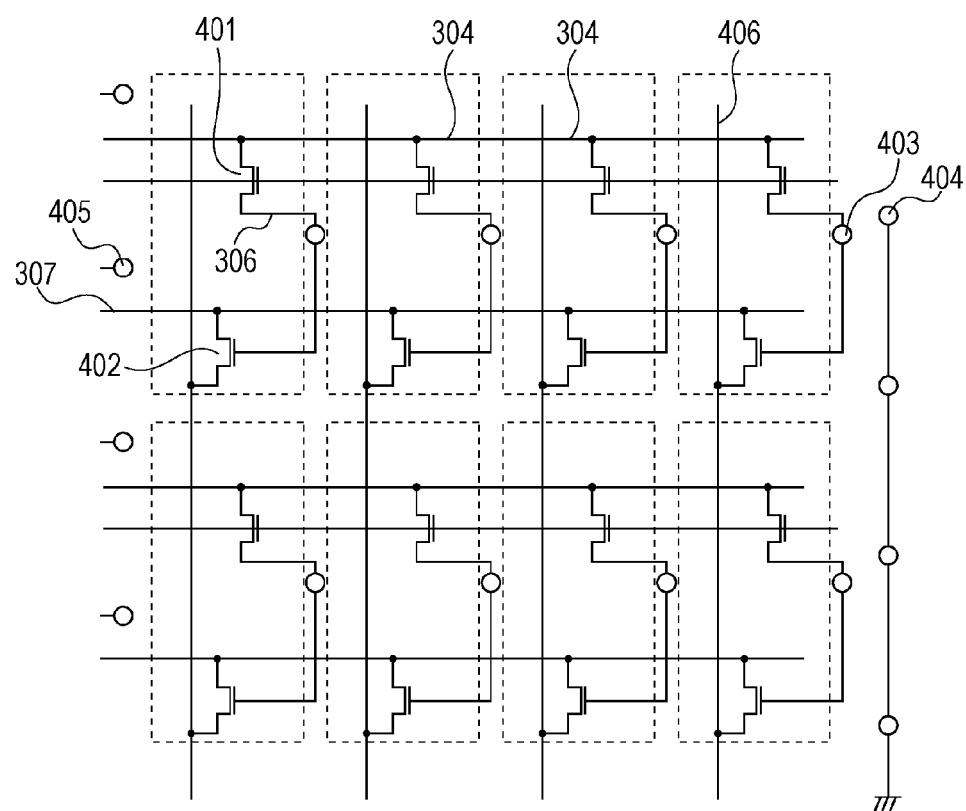
FIG. 4 is an equivalent circuit including pixel configuration elements arranged on the second semiconductor substrate according to the first embodiment.

FIG. 4 is a diagram illustrating an equivalent circuit including pixel configuration elements arranged on the second semiconductor substrate. A reference numeral 401 denotes one of the reset transistors, a reference numeral 402 denotes one of the amplifier transistors, a reference numeral 403 denotes one of the fourth electric connection units, a reference numeral 404 denotes one of the fifth electric connection units, and a reference numeral 405 denotes one of the sixth electric connection units. The sources of the reset transistors 401 are electrically connected to the gates of the amplifier transistors 402. A reference numeral 406 denotes one of common output lines which output signals from the pixels. Portions defined by dotted lines represent the individual pixels.

Figure 5A:
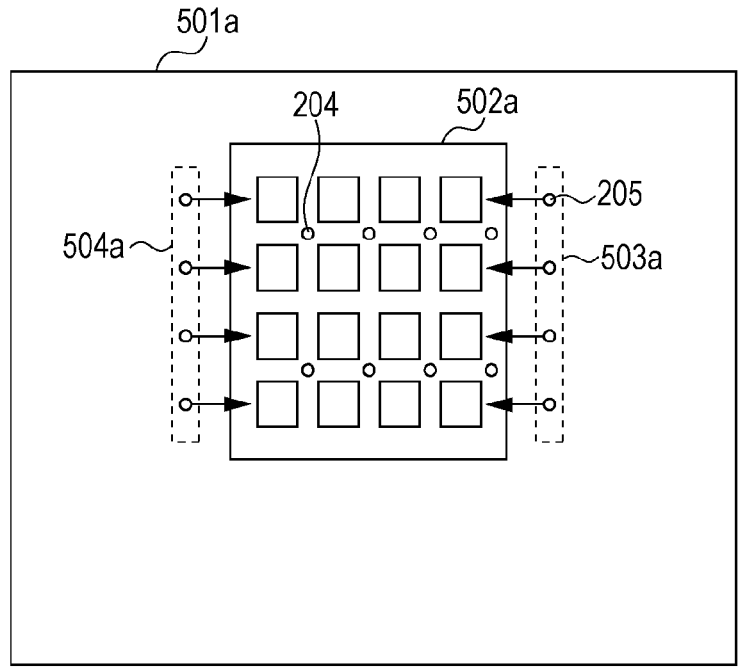
FIG. 5A is a top view illustrating the first semiconductor substrate of the solid-state image pickup device according to the first embodiment.
Figure 5B:
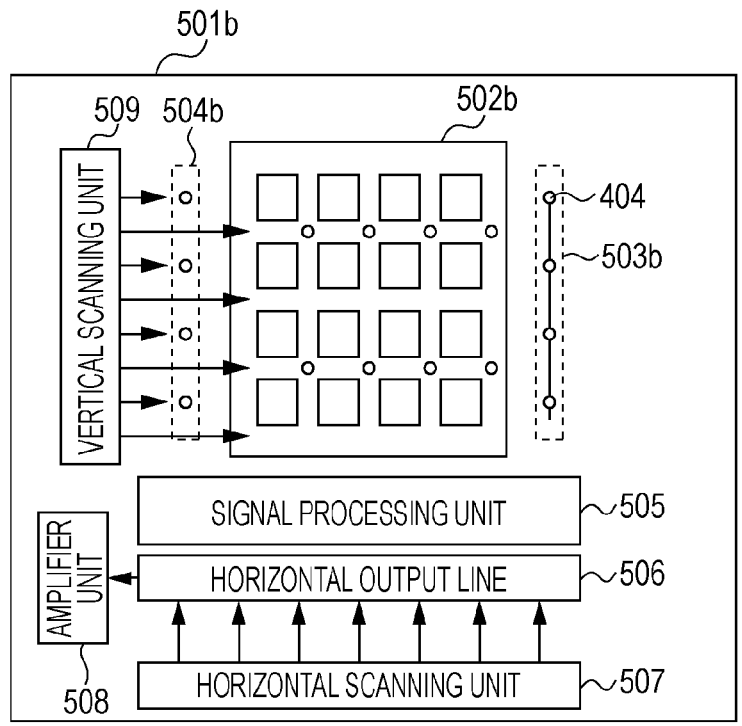
FIG. 5B is a top view illustrating the second semiconductor substrate of the solid-state image pickup device according to the first embodiment.

FIGS. 5A and 5B are top views illustrating the first and second semiconductor substrates, respectively.

Reference numerals 501a and 501b denote the first and second semiconductor substrates, respectively. Reference numerals 502a and 502b denote the pixel regions of the first and second semiconductor substrates. In each of the pixel regions, configuration elements included in the pixels are arranged.

A reference numeral 503a denotes a region including the second electric connection units. A reference numeral 503b denotes a region including the fifth electric connection units. A reference numeral 504a represents a region including the third electric connection units. A reference numeral 504b denotes a region including the sixth electric connection units. The regions 503a and 503b are disposed such that one of the regions 503a and 503b overlaps with the entire other of the regions 503a and 503b when one of the regions 503a and 503b is vertically projected on the other of the regions 503a and 503b. Alternatively, the regions 503a and 503b are disposed such that one of the regions 503a and 503b overlaps with a portion of the other of the regions 503a and 503b when one of the regions 503a and 503b is vertically projected on the other of the regions 503a and 503b. The regions 504a and 504b are disposed such that a portion of one of the regions 504a and 504b overlaps with a portion of the other of the regions 504a and 504b when one of the regions 504a and 504b is vertically projected on the other of the regions 504a and 504b.

A signal processor 505 is capable of processing signals supplied from the pixels in parallel, for example. Specifically, the signal processor 505 corresponds to an amplifier, a CDS circuit, or an AD converter provided for each pixel column. The signal processor 505 includes a plurality of transistors which function as normal switches or portions of calculation amplifiers.

A horizontal output line 506 reads the signals which have been processed in parallel by the signal processor 505 so as to be converted into serial signals and outputs the signals.

A horizontal scanning unit 507 successively supplies pulses so as to convert the signals which have been processed by the signal processor 505 into serial signals. The horizontal scanning unit 507 should have a function of successively selecting the signals which have been processed in parallel by the signal processor 505.

An amplifier unit 508 amplifies and outputs the signals output from the horizontal output line 506. The amplifier unit 508 is disposed where appropriate.

A horizontal scanning unit 509 may include a shift resistor and a decoder. The horizontal scanning unit 509 successively supplies driving pulses to the transfer control lines 104a and the reset gate control lines 305.

In this embodiment, the reference voltage supply line which supplies reference voltages to the photoelectric conversion units is disposed on the first semiconductor substrate and the second electric connection regions which electrically connect the power supply lines to the second semiconductor substrate are arranged outside the pixel region of the first semiconductor substrate. With this configuration, reference voltages can be supplied to the photoelectric conversion units without increasing the FD capacitances.

Second Embodiment

Figure 6A:
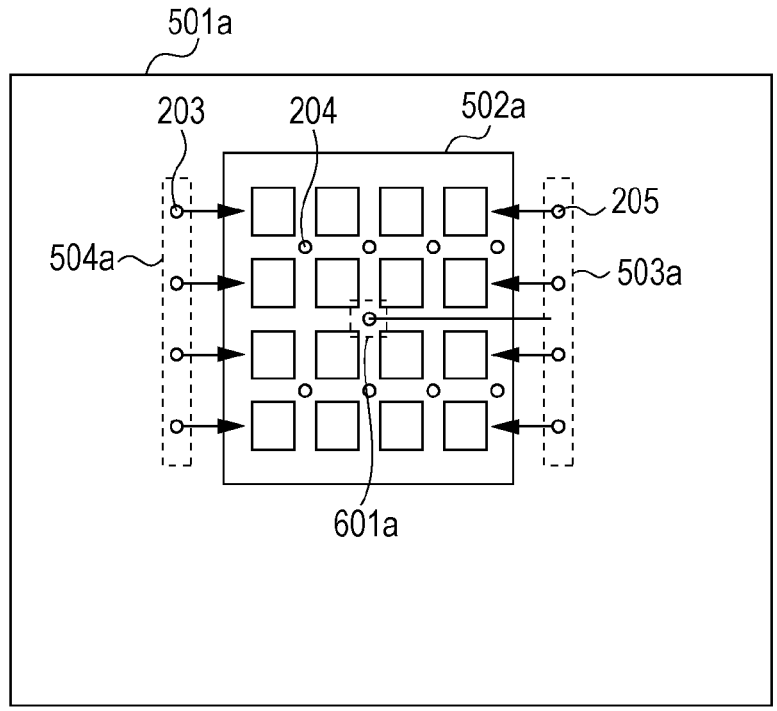
FIG. 6A is a top view illustrating a first semiconductor substrate of a solid-state image pickup device according to a second embodiment.
Figure 6B:
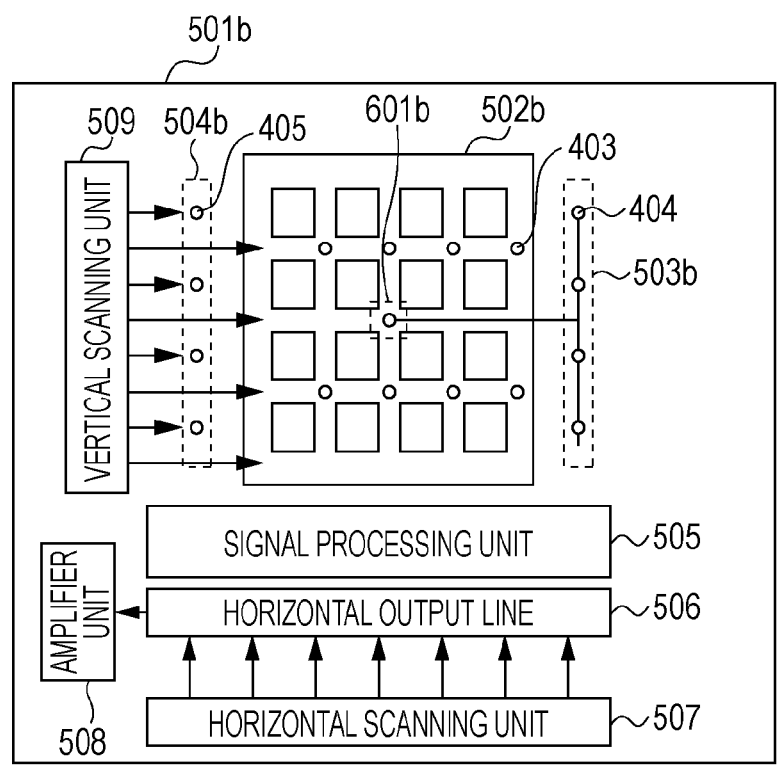
FIG. 6B is a top view illustrating a second semiconductor substrate of the solid-state image pickup device according to the second embodiment.

FIGS. 6A and 6B are top views illustrating first and second semiconductor substrates of a solid-state image pickup device according to a second embodiment. The second embodiment is different from the first embodiment in that seventh electric connection units used to electrically connect a reference voltage supply line 105 to power supply lines disposed on the second semiconductor substrate are disposed in a pixel region of the first semiconductor substrate. Other configurations are the same as those of the first embodiment. Components having functions the same as those of the first embodiment are denoted by reference numerals the same as those of the first embodiment, and therefore, descriptions thereof are omitted.

In this embodiment, the seventh electric connection units are disposed in the pixel region. However, as described in the first embodiment, when the seventh electric connection units are disposed in the pixel region, FD capacitance values may be increased. Therefore, in this embodiment, a reduced number of FDs are disposed in predetermined intervals when compared with first electric connection units electrically connected to the second semiconductor substrate. Specifically, in this embodiment, a single FD is disposed in a center portion. The concrete configuration is not limited to this as long as the number of FDs is smaller than the number of electric connection units which connect the FDs to the second semiconductor substrate.

The embodiments of the present invention have been described in detail hereinabove. However, the present invention is not limited to these and may be appropriately modified without departing from the scope of the invention.

For example, although a FD is shared by two pixels arranged in a horizontal direction, pixels which share an FD are not limited to such pixels. A single pixel may correspond to a single FD.

Furthermore, a plurality of contact plugs which supply reference voltages from the power supply lines may be disposed in the pixel region of the second semiconductor substrate. In the pixel region of the second semiconductor substrate, reset transistors and amplifier transistors are disposed. Well potentials for these transistors are important for determining operation characteristics of the transistors. When the well potentials are varied in some portions of the pixel region, shading is generated in image signals.

However, when reference voltages are supplied to wells included the pixel region of the second semiconductor substrate through a plurality of contact plugs, the shading may be suppressed. Furthermore, the contact plugs may be disposed for individual amplifier transistors or for individual groups of amplifier transistors. In a case where gate areas of the amplifier transistors are enlarged so that 1/f noise is suppressed while a small pixel pitch is to be attained, the contact plugs may not be arranged for individual amplifier transistors but the number of contact plugs may be reduced so that the contact plugs are arranged for individual groups of amplifier transistors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-288459, filed Dec. 18, 2009, which is hereby incorporated by reference herein in its entirety.

REFERENCE SIGNS LIST

101 Photoelectric conversion unit
103 Floating diffusion
106 First electric connection unit
109 Second electric connection unit
301 Reset transistor
302 Amplifier transistor

The invention claimed is:

1. A solid-state image pickup device having a plurality of pixels, each including a photoelectric conversion unit, a floating diffusion, and a transfer transistor which transfers charges of the photoelectric conversion unit to the floating diffusion, a reset transistor which supplies a reset potential to the floating diffusion, an amplifier transistor which amplifies a signal obtained in accordance with potential changes of the floating diffusion and outputs a signal, a reference voltage supply line which supplies reference voltages to the photoelectric conversion unit, a first substrate including a pixel region including the photoelectric conversion unit, the floating diffusion and the transfer transistor, and the reference voltage supply line, and a second substrate including a pixel region including at least the reset transistor or the amplifier transistor, the solid-state image pickup device comprising:

power supply lines configured to supply voltages to the reference voltage supply line and disposed on the second substrate;

a plurality of first electric connection units configured to electrically connect the floating diffusions to the reset transistors and the amplifier transistors which are disposed on the second substrate; and a plurality of second electric connection units configured to electrically connect the reference voltage supply line to the power supply lines, wherein the first electric connection units are disposed in the pixel region of the first substrate and the second electric connection units are disposed outside the pixel region of the first substrate, and wherein a plurality of contact plugs configured to supply reference voltages from the power supply lines to wells included in the pixel region of the second substrate are disposed in the pixel region of the second substrate.

2. The solid-state image pickup device according to claim 1, wherein a scanning circuit which supplies driving signals to gates of the transfer transistors is disposed on the second substrate, and a plurality of third electric connection units which are electrically connected the scanning circuit to a gate wiring of the transfer transistor are disposed on the first substrate and the third electric connection units are disposed outside the pixel region of the first substrate.

3. The solid-state image pickup device according to claim 1,
wherein the amplifier transistors and the reset transistors are disposed on the second substrate.

4. The solid-state image pickup device according to claim 3, wherein a gate area of the amplifier transistor is larger than a gate area of the reset transistor.

5. The solid-state image pickup device according to claim 1, wherein the contact plugs are provided for individual amplifier transistors.

6. The solid-state image pickup device according to claim 1,
wherein
the number of the second electric connection units disposed in the pixel region of the first substrate is smaller than the number of the first electric connection units disposed in the pixel region of the first substrate.

* * * * *